(12) United States Patent
Damodaran et al.

(10) Patent No.: US 9,003,122 B2
(45) Date of Patent: Apr. 7, 2015

(54) LEVEL ONE DATA CACHE LINE LOCK AND ENHANCED SNOOP PROTOCOL DURING CACHE VICTIMS AND WRITEBACKS TO MAINTAIN LEVEL ONE DATA CACHE AND LEVEL TWO CACHE COHERENCE

(75) Inventors: Raguram Damodaran, Plano, TX (US); Abhijeet Ashok Chachad, Plano, TX (US); Jonathan (Son) Hung Tran, Murphy, TX (US); David Matthew Thompson, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 680 days.

(21) Appl. No.: 13/247,209

(22) Filed: Sep. 28, 2011

(65) Prior Publication Data

US 2012/0198163 A1    Aug. 2, 2012

Related U.S. Application Data

(60) Provisional application No. 61/387,283, filed on Sep. 28, 2010.

(51) Int. Cl.

| | | |
|---|---|---|
| G06F 12/08 | (2006.01) |
| G06F 11/10 | (2006.01) |
| G06F 7/483 | (2006.01) |
| G06F 9/30 | (2006.01) |
| H03M 13/35 | (2006.01) |
| H03M 13/29 | (2006.01) |
| H03K 19/00 | (2006.01) |
| G06F 1/32 | (2006.01) |
| H03K 21/00 | (2006.01) |
| G06F 12/02 | (2006.01) |

(52) U.S. Cl.
CPC ............ *G06F 11/1064* (2013.01); *G06F 7/483* (2013.01); *G06F 9/3012* (2013.01); *H03M 13/353* (2013.01); *H03M 13/2903* (2013.01); *H03K 19/0016* (2013.01); *G06F 1/3296* (2013.01); *H03K 21/00* (2013.01); *G06F 12/0246* (2013.01); *Y02B 60/32* (2013.01)

(58) Field of Classification Search
CPC ............ G06F 12/0811; G06F 12/0846; G06F 12/0897; G06F 12/1063
USPC .......................................................... 711/122
See application file for complete search history.

(56) References Cited

U.S. PATENT DOCUMENTS

| | | | | | |
|---|---|---|---|---|---|
| 5,564,035 | A | * | 10/1996 | Lai ................................ | 711/144 |
| 5,860,117 | A | * | 1/1999 | Cherabuddi .................. | 711/151 |
| 6,058,447 | A | * | 5/2000 | Holst et al. .................... | 710/105 |
| 6,148,372 | A | * | 11/2000 | Mehrotra et al. ............. | 711/122 |

(Continued)

*Primary Examiner* — Matthew Bradley
*Assistant Examiner* — Ramon A Mercado
(74) *Attorney, Agent, or Firm* — Robert D. Marshall, Jr.; Frank D. Cimino

(57) ABSTRACT

This invention assures cache coherence in a multi-level cache system upon eviction of a higher level cache line. A victim buffer stored data on evicted lines. On a DMA access that may be cached in the higher level cache the lower level cache sends a snoop write. The address of this snoop write is compared with the victim buffer. On a hit in the victim buffer the write completes in the victim buffer. When the victim data passes to the next cache level it is written into a second victim buffer to be retired when the data is committed to cache. DMA write addresses are compared to addresses in this second victim buffer. On a match the write takes place in the second victim buffer. On a failure to match the controller sends a snoop write.

2 Claims, 7 Drawing Sheets

(56) References Cited

U.S. PATENT DOCUMENTS

| | | | |
|---|---|---|---|
| 6,275,909 B1* | 8/2001 | Arimilli et al. | 711/146 |
| 6,321,305 B1* | 11/2001 | Arimilli et al. | 711/143 |
| 6,408,345 B1* | 6/2002 | Fuoco et al. | 710/22 |
| 8,117,395 B1* | 2/2012 | Rohana et al. | 711/128 |
| 2002/0169935 A1* | 11/2002 | Krick et al. | 711/167 |
| 2003/0084250 A1* | 5/2003 | Gaither et al. | 711/133 |
| 2005/0132140 A1* | 6/2005 | Burger et al. | 711/128 |
| 2008/0109606 A1* | 5/2008 | Lataille et al. | 711/133 |
| 2010/0153650 A1* | 6/2010 | Guthrie et al. | 711/133 |

* cited by examiner

LEVEL ONE DATA CACHE LINE LOCK AND ENHANCED SNOOP PROTOCOL DURING CACHE VICTIMS AND WRITEBACKS TO MAINTAIN LEVEL ONE DATA CACHE AND LEVEL TWO CACHE COHERENCE

CLAIM OF PRIORITY

This application claims priority under 35 U.S.C. 119(e)(1) to U.S. Provisional Application No. 61/387,283 filed Sep. 28, 2010.

TECHNICAL FIELD OF THE INVENTION

The technical field of this invention is cache for digital data processors.

BACKGROUND OF THE INVENTION

This invention is applicable to data processing systems with multi-level memory where the second level (L2) memory used for both unified (code and instructions) level two cache and flat (L2 SRAM) memory used to hold critical data and instructions. The second level memory (L2) is used for multiple purposes including unified instruction and data level two cache, directly addressable SRAM memory used to hold critical data and code accessible by both external and internal direct memory access (DMA) units.

When the level one data cache controller is granted access to the level one data cache, this access could force an existing line to be evicted. The CPU can also force the level one data cache to evict lines though the block writeback operation. At the same time, the level two cache could be receiving a DMA access to the same line. This situation could break coherency, if DMA data were committed incorrectly. This could occur by writing to the level two memory then overwriting that data with the level one cache victim. This could also occur by sending the DMA data as a snoop write to the level one data cache. This forces the level one data cache to write the DMA data to its cache after the victim has been evicted. This effectively, drops the DMA write. Thus when a victim is in progress, a DMA write sent as snoop could miss the victim.

SUMMARY OF THE INVENTION

This invention assures cache coherence in a multi-level cache system upon eviction of a higher level cache line. Data identifying an evicted cache line is entered into an entry within a victim buffer when selected for eviction. An entry is retired from the victim buffer when the corresponding cache line data reaches the next cache level. On a DMA access that may be cached in the higher level cache the lower level cache sends a snoop write. The address of this snoop write is compared with cached data and cache lines in the victim buffer. On a hit in the victim buffer the write completes in the victim buffer. When the victim data passes to the next cache level it is written into a second victim buffer. An entry in this second victim buffer is retired when the data is committed to cache. DMA write addresses are compared to addresses in this second victim buffer. On a match the write takes place in the second victim buffer. On a failure to match the controller sends a snoop write. In the preferred embodiment the next cache level uses shadow tags to determine whether the data is cached in higher level cache before sending the snoop write.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
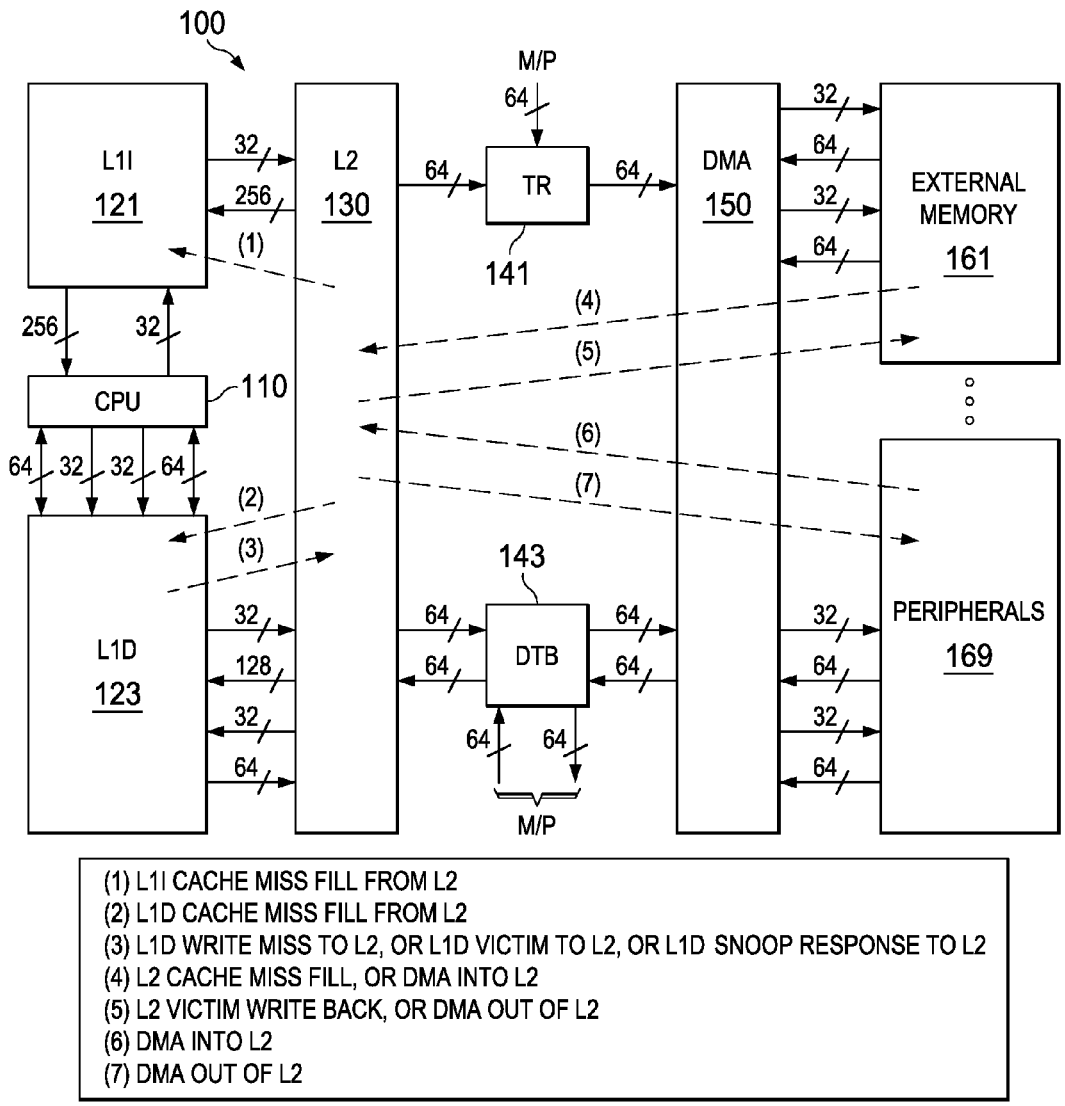
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
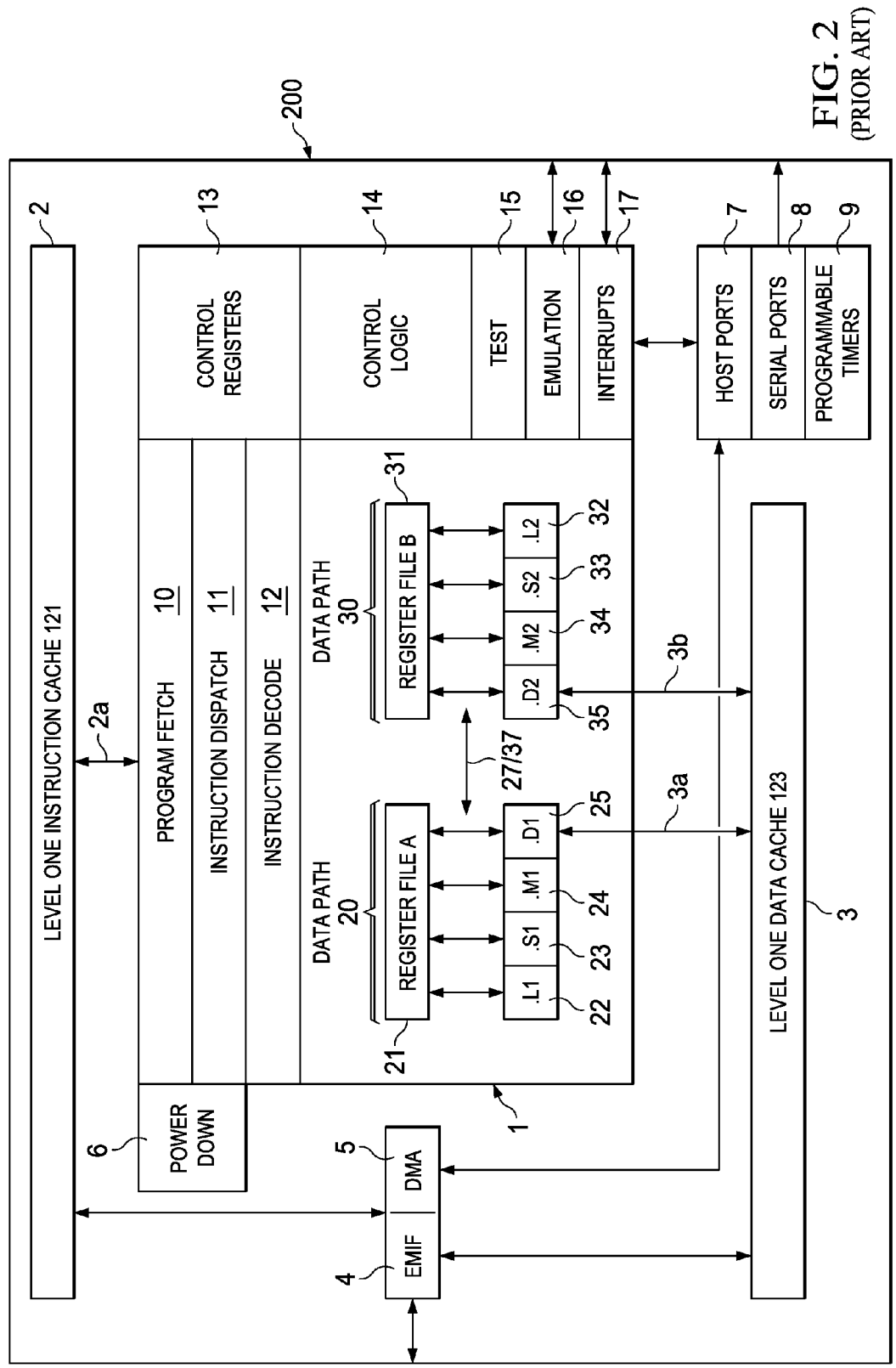
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
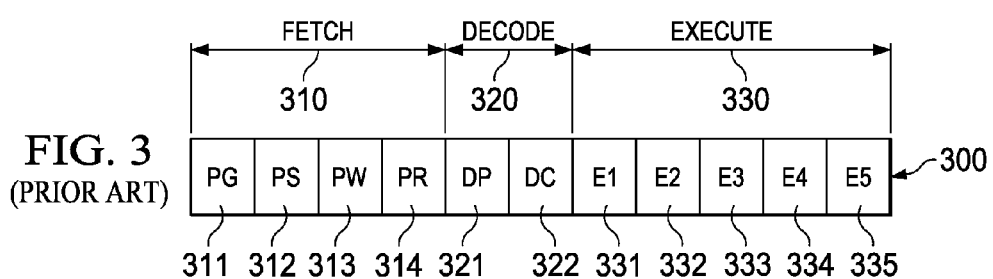
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figures 4, 5:
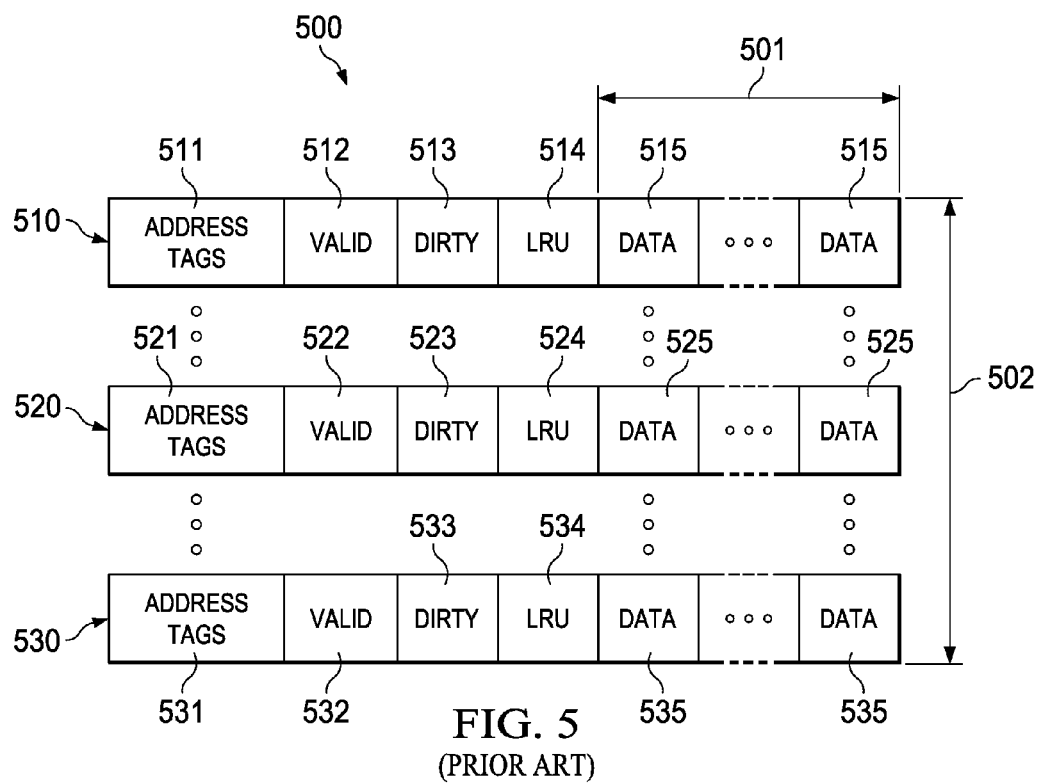
FIG. 4 illustrates the instruction syntax of the very long instruction word digital signal processor core illustrated in FIG. 2 (prior art)
FIG. 5 illustrates the details of a set of typical prior art cache lines (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional Register | creg | | | z |
|---|---|---|---|---|
| | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 illustrates the details of plural cache lines such as used in L1I cache 121, L1D cache 123 and L2 cache 130 illustrated in FIG. 1. Cache 500 illustrated in FIG. 5 includes cache lines 510, 520 and 520 are representative of the internal structure of cache 500. Each of cache lines 510, 520 and 530 includes: respective address tags 511, 521 and 522; respective valid bits 512, 522 and 523; respective dirty bits 513, 523 and 533; respective least recently used (LRU) indicators 514, 524 and 534; and respective data words 515, 525 and 535. Each cache line 510, 520 and 530 includes plural respective data words 515, 525 and 535. The bit length of data words 515, 525 and 535 is set by the minimal addressable data amount of CPU 110. This is typically 8 bits/1 byte.

Cache 500 stores data from more distant memories such as external memory 161 which are accessed by a multi-bit address. Cache 500 is organized to facilitate this storage and to facilitate finding such data in the cache. Each cache line 510, 520 and 530 typically stores $2^N$ respective data words 515, 525 and 535, when N is an integer. The position of data words 515, 525 and 535 within the corresponding cache line 510, 520 and 530 along the dimension 501 serves as a proxy for the least significant bits of the address.

The position of cached data within lines along dimension 502 serves as a proxy for the next most significant bits of the address. The corresponding address tags 511, 521 and 531 form the remainder of the data word address. To determine if a memory access is to data cached within cache 500 (a cache hit), cache 500 compares the address tags for all cache lines to the most significant bits of the memory location accessed. Upon a detecting a match, the position within the cache line along dimension 501 corresponds to the least significant bits of the address permitting identification of the data word accessed.

Each data word 510, 520 and 530 includes a corresponding valid bit 512, 522 and 532. A first state of this valid bit indicates the corresponding data words 515, 525 or 535 are valid. An opposite state of this valid bit indicates the corresponding data words 515, 525 or 535 are not valid. There are several instances where data stored within cache 500 would not be valid. Upon initial activation of digital signal processor system 100 the L1I cache 121, L1D 123 cache and L2 cache 130 would not be loaded. Thus they would not store valid data. Accordingly, all cache lines are initially marked invalid. During a cache access a match of a requested address with address tags 511, 521 or 531 would not detect a match unless the corresponding valid bit 512, 522 or 532 indicated the data was valid.

Each data word 510, 520 and 530 includes a corresponding dirty bit 513, 523 and 533. A first state of this valid bit indicates the corresponding data words 515, 525 or 535 are dirty. An opposite state of this valid bit indicates the corresponding data words 515, 525 or 535 are not dirty (clean). Cache memory is generally used for both read accessed and write accesses. Upon a cache hit for a write access, the write data is written into the corresponding location within cache 500. According to the preferred writeback technique, this write data is not immediately forwarded to external memory 161. Instead the respective dirty bit 513, 523 or 533 is set to indicate dirty. A dirty indication means that there has been a write to the cached data not currently reflected in the base memory. According to the writeback technique this data is written to the base memory with the expectation that this writeback can accumulate plural writes to the memory location and nearby memory locations within the same cache line to reduce traffic on the bus to external memory 161.

The least recently used (LRU) bits 514, 524 and 534 are used when a cache line is replaced. Because the cache cannot hold all the data stored in the large, slow memory, the data within the cache must be replaced with new data regularly. Using a data words location within dimensions 501 and 502 as proxy for the least significant bits introduces a problem in locating data within cache 500. If there is only a single cache line having the same location on dimensions 501 and 502, then plural data from the large, slow memory will alias to the same cache line in cache 500. This is data having the same least significant address bits corresponding to dimensions 501 and 502 but differing most significant address bits. An access to such aliased data would require the previous data at that cache line to be replaced. This is considered disadvantageous. A typical prior art cache is set associative. Thus a set of cache lines have the same location on dimensions 501 and 502. Typical sets include two members (two-way set associative) or four members (four-way set associative). Each cache line of such a set is called a way. A cache miss to an address that aliases to one of these sets needs only to evict one of these ways. Determination of which way to evict is typically made based on prior usage of these ways. According to both the temporal and spatial locality principles more recently used cache ways are more likely to be reused than less recently used cache ways. LRU bits 514, 524 and 534 track accesses to cache ways within the set. When data is to be replaced the LRU bits indicate the least recently used way for replacement. Maintaining cache coherence requires writeback of a dirty way upon such replacement.

Figure 6:
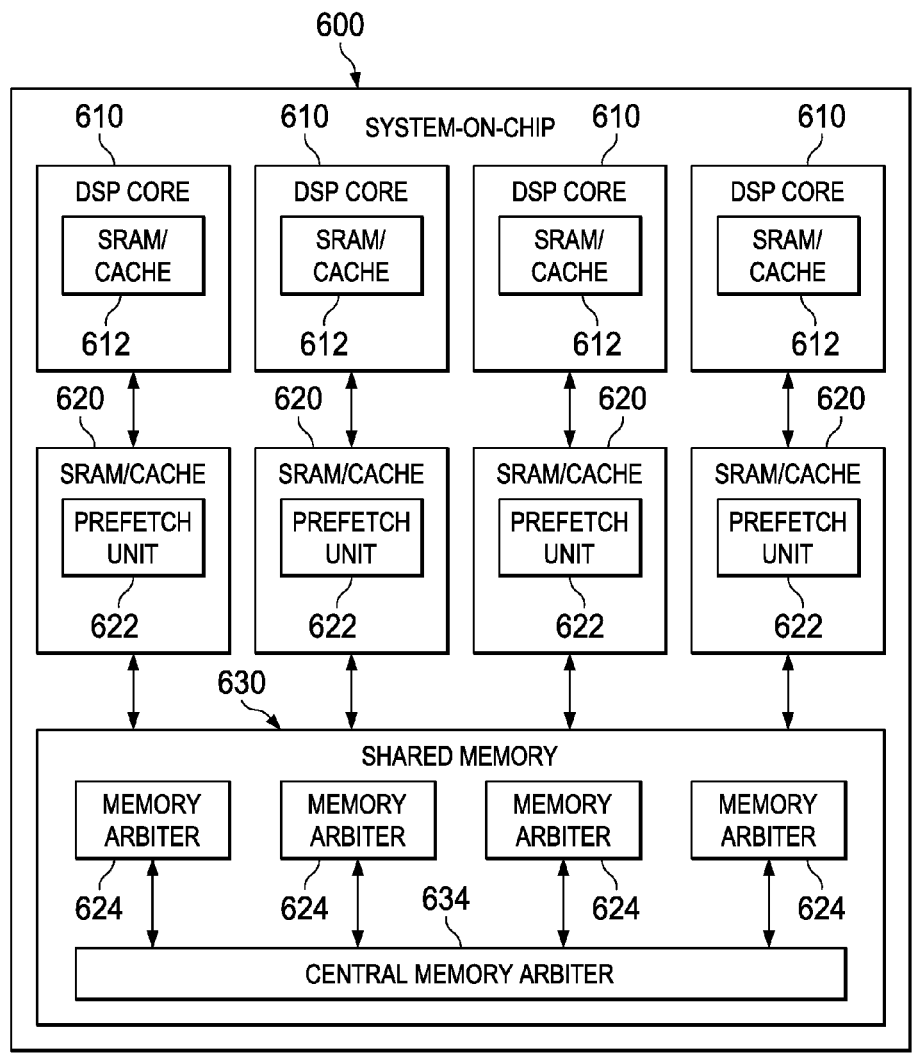
FIG. 6 illustrates a computing system including a local memory arbiter according to an embodiment of the invention.

FIG. 6 is a block diagram illustrating a computing system including a local memory arbiter according to an embodiment of the invention. FIG. 6 illustrates system on a chip (SoC) 600. SoC 600 includes one or more DSP cores 610, SRAM/Caches 620 and shared memory 630. SoC 600 is preferably formed on a common semiconductor substrate. These elements can also be implemented in separate substrates, circuit boards and packages. For example shared memory 630 could be implemented in a separate semiconductor substrate. FIG. 6 illustrates four DSP cores 610, but SoC 600 may include fewer or more DSP cores 610.

Each DSP core 610 preferably includes a level one data cache such as L1 SRAM/cache 612. In the preferred embodiment each L1 SRAM/cache 612 may be configured with selected amounts of memory directly accessible by the corresponding DSP core 610 (SRAM) and data cache. Each DSP core 610 has a corresponding level two combined cache L2 SRAM/cache 620. As with L1 SRAM/cache 612, each L2 SRAM/cache 620 is preferably configurable with selected amounts of directly accessible memory (SRAM) and data cache. Each L2 SRAM/cache 620 includes a prefetch unit 622. Each prefetch unit 622 prefetchs data for the corresponding L2 SRAM/cache 620 based upon anticipating the needs of the corresponding DSP core 610. Each DSP core 610 is further coupled to shared memory 630. Shared memory 630 is usually slower and typically less expensive memory than L2 SRAM/cache 620 or L1 SRAM/cache 612. Shared memory 630 typically stores program and data information shared between the DSP cores 610.

In various embodiments, each DSP core 610 includes a corresponding local memory arbiter 624 for reordering memory commands in accordance with a set of reordering rules. Each local memory arbiter 624 arbitrates and schedules memory requests from differing streams at a local level before sending the memory requests to central memory arbiter 634. A local memory arbiter 624 may arbitrate between more than one DSP core 610. Central memory arbiter 634 controls memory accesses for shared memory 630 that are generated by differing DSP cores 610 that do not share a common local memory arbiter 624.

Figure 7:
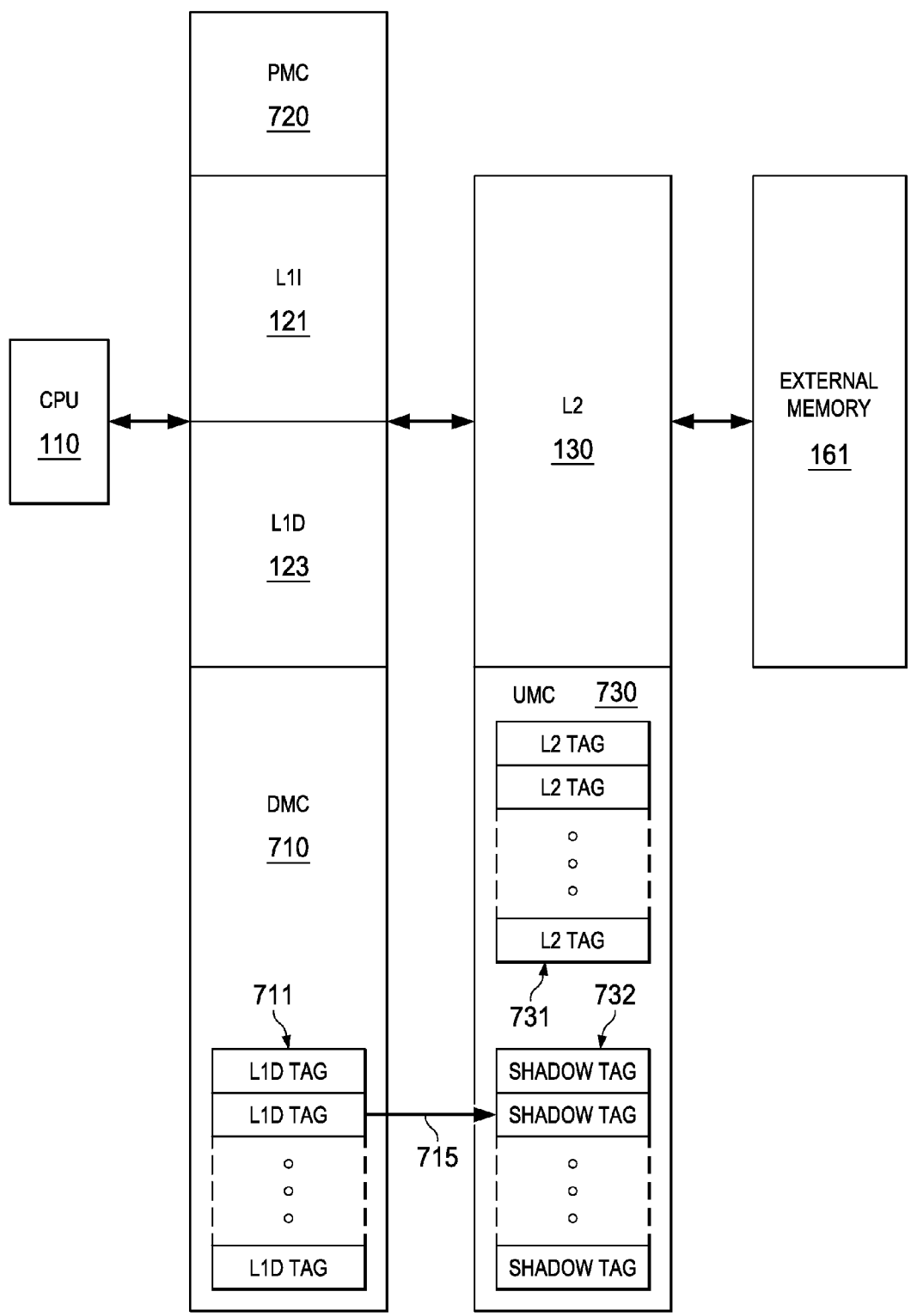
FIG. 7 is a further view of the digital signal processor system of this invention illustrating the various cache controllers.

FIG. 7 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 is controlled by data memory controller (DMC) 710. Data transfers into and out of L1I cache 121 is controlled by program memory controller (PMC) 720. Data transfers into and out of L2 130 including both cache and directly addressable memory (SRAM) are controlled by unified memory controller (UMC) 730.

FIG. 7 illustrates further details of DMC 710 and UMC 730. DMC 710 includes L1D cache tags 711. These tags are the non-data part of cache lines 510, 520 and 530 illustrated in FIG. 5 for L1D cache 123. UMC 730 includes two sets of cache tags. The first set of cache tags are L2 tags 731. These are non-data part of cache lines 510, 520 and 530 illustrated in FIG. 5 for L2 cache 130. The second set of cache tags are shadow tags 732. As shown by bus 715 shadow tags 732 generally correspond to L1D cache tags 711 except these are located in UMC 730. Shadow tags 732 include at least the valid and dirty status of the corresponding cache lines in L1D cache 123.

UMC 730 uses shadow tags 732 to implement snoop read and write coherence. UMC 730 tracks the status of L1D cache lines. Shadow tags 732 are used only for snoops intending to keep L2 SRAM coherent with the level one data cache. Thus updates for all external cache lines are ignored. Shadow tags 732 are updated on all L1D cache allocates and all dirty and invalidate modifications to data stored in L2 SRAM. These interactions happen on different interfaces, but the traffic on that interface includes level one data cache accesses to both external and level two directly addressable lines. These interactions create extra traffic on these interfaces and creating extra stalls to the CPU. Thus in this invention shadow tags 732 are updated only on a subset of less than all updates of the level one tags 711.

These tag updates are pipelined out from DMC 710 to UMC 730. Command ordering requirements require DMC 710 to ensure that all tag updates prior to a particular command have been send out to shadow tags 732. L1D cache 123 and CPU 110 stall until that is complete. The performance improvement from this invention is a result of having to do this very few times. Additional improvements come from reduced dynamic power consumption as a result of largely reduced accesses to the shadow tags 732.

Figure 8:
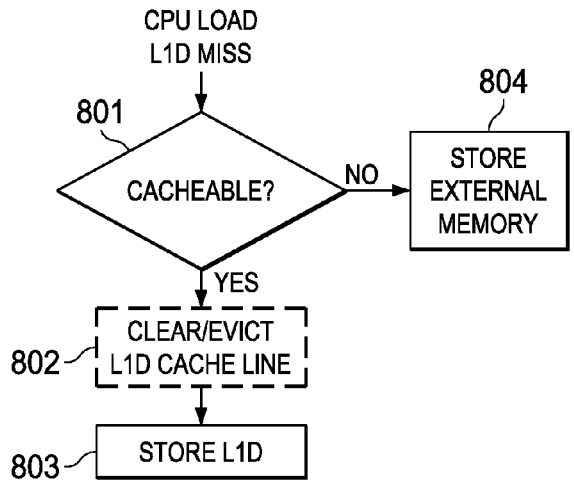
FIG. 8 is a flow chart illustrating action when a CPU loads misses level one cache 123.
Figure 9:
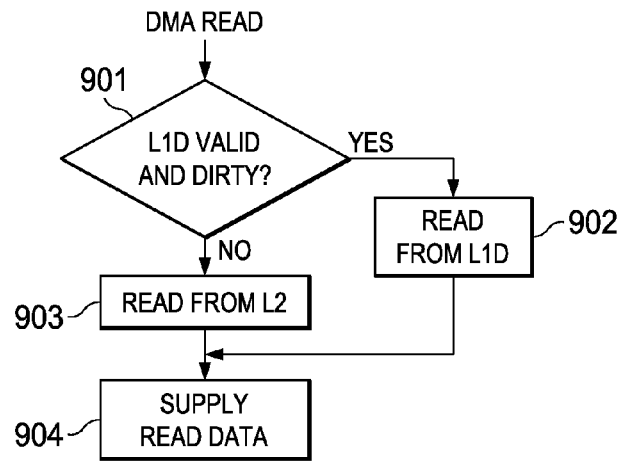
FIG. 9 is a flow chart illustrating action on a DMA read.
Figure 10:
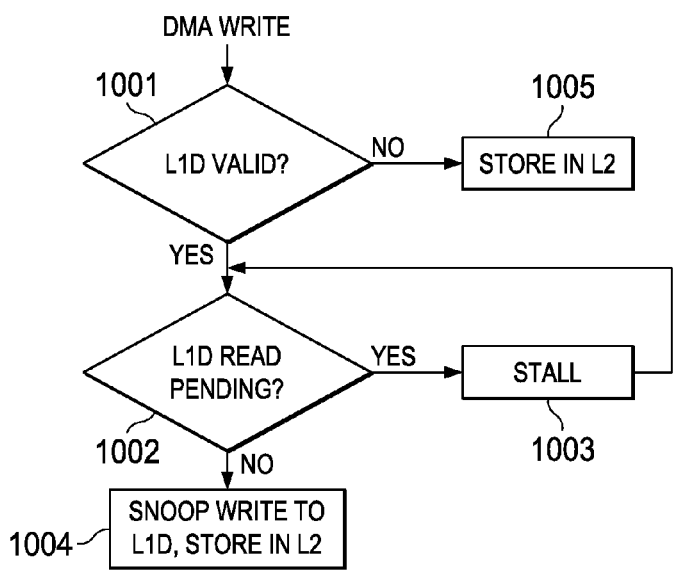
FIG. 10 is a flow chart illustrating action on a DMA write.

FIGS. 8, 9 and 10 are flow charts illustrating the operation of this invention. UMC 730 includes a shadow copy of L1D tags 711. Shadow tags 732 contain a subset of the information held in L1D tags 711. Shadow tags 732 track what addresses L1D 123 holds and whether the cache lines associated with these addresses are clean or dirty. UMC 730 queries shadow tags 732 whenever an outside DMA request reads from or writes to L2 SRAM.

FIG. 8 illustrates action when a CPU 110 loads that misses L1D cache 123 occurs. On such a CPU 110 load, L2 cache 130 returns cacheability information on the requested address and data (test block 801). If this data is cacheable (Yes at test block 801), L1D cache 123 then caches this data (block 803). If necessary this includes replacing a clean line or evicting a dirty cache line (block 802). If this data is not cacheable (No at test block 801), the CPU load completes in external memory (block 804).

FIG. 9 illustrates action when a DMA read is received at UMC 730. On such a DMA read test block 901 determines from shadow tags 732 if the L1D cache 123 holds valid and dirty data for this address. If a valid and dirty copy of the data sought in the DMA read is held in L1D cache 123 (Yes at test block 901), then UMC 730 snoops this address in L1D cache 123. Such a snoop is a read request to L1D cache 123 for this data (block 902). If a valid and dirty copy of the data sought in the DMA read is not held in L1D 123 (No at test block 901), then the data is read from L2 cache 130 (block 903). In this case either the L1D copy is clean and thus is the same as the L2 copy or L1D cache 123 does not hold a valid copy. In either case the read data is supplied to the DMA requestor (block 904).

FIG. 10 illustrates action when a DMA write is received at UMC 730. On such as DMA write test block 1001 determines from shadow tags 732 if L1D cache 123 holds a valid copy of the data at this address. If L1D cache 123 holds a valid copy (Yes at test block 1001), then UMC 730 would ordinarily perform a snoop read this address in L1D cache 123. This invention performs an additional check. Test block 1002 determines if there is a pending L1D read to this address. This test would ordinarily be made on boundaries equal to the L1D cache line size. Thus any DMA write to an address in the same L1D cache line as a pending L1D read satisfies this test. The manner of making this check is described below in conjunction with FIG. 11. If L2 cache 130 receives a DMA write to the line that L1D cache 123 is reading (Yes at test block 1002), UMC 730 stalls this DMA access and all following accesses (block 1003). The DMA write remains stalled until the L1D read operation completes. This is evidenced by a No at test block 1002. On completion of any blocking L1D read operations (No at test block 1002), UMC 730 will send a snoop write to L1D cache 123 for that line (block 1004). This completes the write in L1D cache 123. In the preferred embodiment this data is also written to L2 cache 130 assuring cache coherence (block 1004). If L1D cache 123 does not hold a valid copy (No at test block 1001), then UMC 730 completes the DMA write in L2 cache 130 (block 1005).

Figure 11:
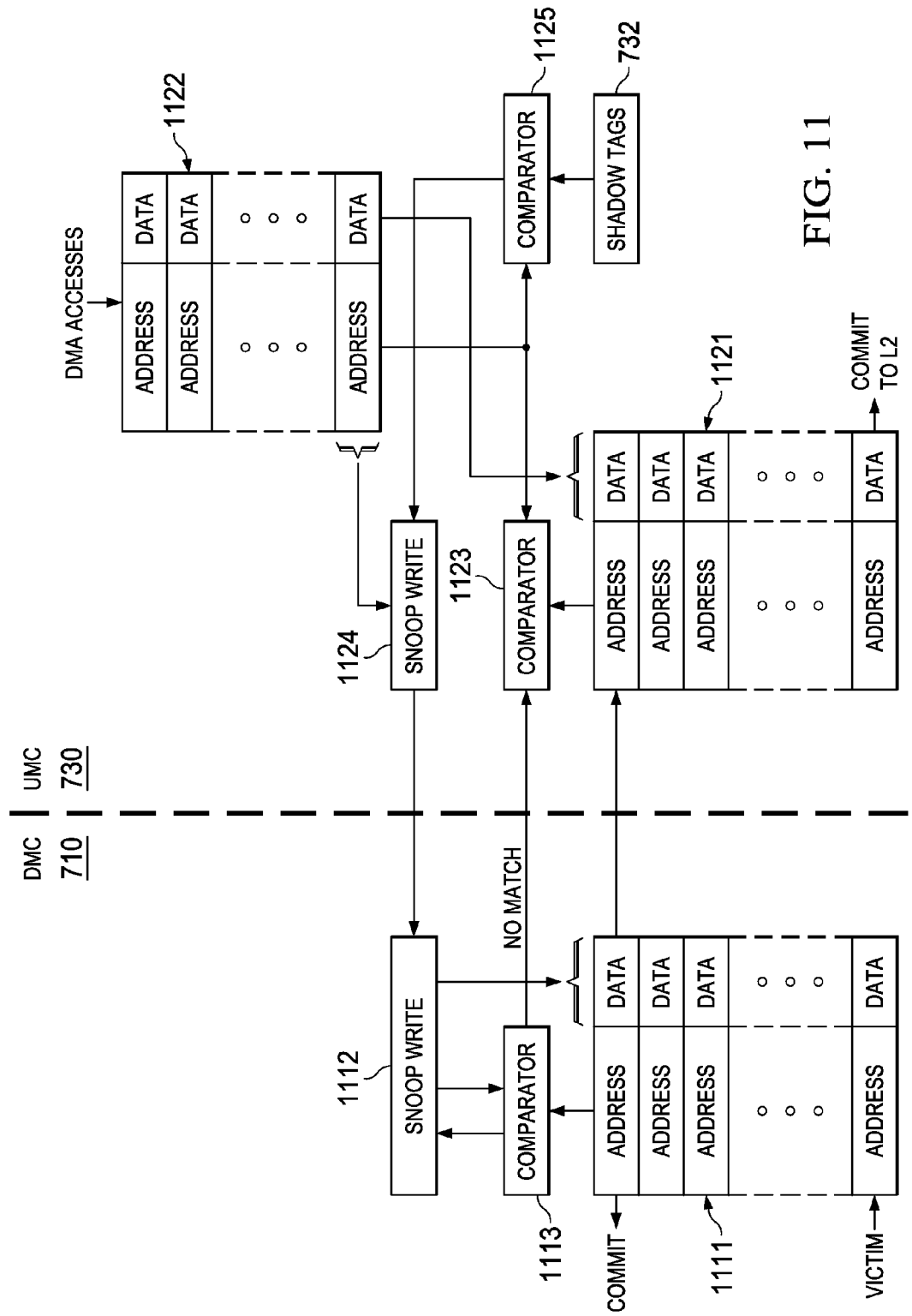
FIG. 11 illustrates hardware in the level one data cache controller and the level two memory controller handling interlocks on victim eviction from the level one cache.

FIG. 11 illustrates hardware in the level one data cache controller and the level two memory controller handling interlocks on victim eviction from the level one cache. Some parts illustrated in FIG. 11 are included in DMC 710 and some parts are included in UMC 730 as indicated by the dashed line. DMC 710 includes victim buffer 1111. Data identifying the cache line is entered into an entry within victim buffer 1111 when DMC 710 selects that line for eviction. Each victim buffer entry also includes the cache line data being evicted. In this case eviction means that the cache line is dirty and altered data must be written back on replacing the cache line. An entry is retired from victim buffer 1111 when the corresponding cache line data reaches UMC 730. DMC 710 has a snoop write port 1112 connected to UMC 730. UMC 730 supplies a snoop write on snoop write port 1112 when it receives a DMA access that may be cached within L1D cache 123. Comparator 1113 compares the snoop write address to the addresses of cache lines in victim buffer 1111. On a match to victim buffer 1111 the requested DMA write takes place in victim buffer 1111. If there is no match, DMC 710 signals no match to UMC 730.

Victim processing progresses until the cache line data passes to UMC 730. This cache line data is stored in victim buffer 1121. When passage of this data is acknowledged by UMC 730 DMC 710 retires the corresponding entry from victim buffer 1111. A cache line is entered into an entry within victim buffer 1121 when UMC 730 receives the cache line from DMC 710. An entry in victim buffer 1121 is retired when the data is committed to L2 cache 130. In UMC 730 a DMA write access is received at DMA write buffer 1122. Comparator 1123 compares the address of the DMA write with the addresses of cache lines in victim buffer 1121. On a match UMC 730, comparator 1123 stalls the DMA write until the allocate is committed to L2 cache 130. Writes to L2 cache 130 are expected to require only a few cycles so this stall is generally short. Alternatively UMC 730 performs the DMA write in victim buffer 1121 avoiding a stall. On a non-match UMC 730 sends a snoop write to DMC 710 via snoop write port 1124. In the preferred embodiment shadow tags comparator 1125 compares the address of the DMA write with shadow tags 732. This enables UMC 730 to determine whether the data is cached in L1D cache 123 before sending the snoop write. The snoop write is sent to DMC 710 only if shadow tags 732 indicate L1D cache 123 holds data corresponding to the DMA write. An entry is retired from DMA write buffer 1122 upon confirmation of write into victim buffer 1111 or victim buffer 1121. If neither L1D cache 123, victim buffer 1111 nor victim buffer 1121 hold the data, then UMC 730 completes the write into L2 SRAM. In this case there is no potentially interfering cache copy of the data to be corrupted.

When L1D cache 123 evicts a line, either due to a user controlled coherence operation or while processing a read miss for a dirty line, multiple locks are set. This prevents data corruption by a DMA write to the same line as the victim. The life of the DMA transaction and the L1D victim in the L1D and L2 controller are tracked. Various locks set when they interact. Initially L1D cache 123 owns the victim and UMC 730 is allowed to send snoop writes to the victim line. Upon such a snoop L1D cache 123 checks for the status of all pending snoops and victims in its pipeline and handles data updates in the correct order. After UMC 730 sees the victim from DMC 710, it flushes any DMA requests in its pipeline to that line and then starts processing the L1D cache victim. At this time instead of checking just shadow tags 732, UMC 730 also checks if the DMA hits either the victim in processes. If L1D cache 123 still has the victim in its cache or victim buffer, UMC 730 will snoop to that line. If the line is being evicted, UMC 730 stalls any DMA request to that line.

This invention also includes a new protocol to control the transfer of the L1D cache victim line between DMC 710 and UMC 730. The protocol starts when DMC 710 sends information to UMC 730 on a victim line before the victim starts. This allows UMC 730 to setup its locks. When the read victim starts, there is a handshake between the DMC 710 and UMC 730 based on these locks and the possible presence of any DMA request or potential snoops in the L2 pipeline. Once the victim is accepted, the UMC 730 owns the victim line and prevents any access to it.

Prior art systems would stall the L1D victim if there was any DMA to the line being evicted. This caused performance degradation. Other prior art solutions included a complex handshake through which the L2 controller and the L1D cache controller tracked the state of the victim. This included control bits that forced the L1D cache controller to commit the snoop to either its cache or victim buffer. This handshake also added latency cycles to the DMA.

In this invention both controllers track the status of the victim line, and then decides whether to snoop or not. This is tracked through a number of interface signals. These operations do not add cycles to the DMA. This tracking instead is used to correctly commit data to the victim line in various stages of its life.

What is claimed is:

1. A data processing system comprising:
    a central processing unit executing program instructions to manipulate data;
    a first level data cache connected to said central processing unit temporarily storing in a plurality of first cache lines data for manipulation by said central processing unit;
    a second level memory connected to said first level cache including second level cache temporarily storing in a plurality of second cache lines data for manipulation by said central processing unit and a second level local memory directly addressable by said central processing unit; and
    a direct memory access unit connected to said central processing unit controlling data transfer, said direct memory access unit operating under control of said central processing unit to control data transfers including transferring data into and out of said second level local memory;
    a first level cache controller connected to said first level cache capable controlling data transfers into and out of said first level cache including
        a first victim buffer having a plurality of entries, each entry storing a first victim address corresponding to data stored in a first cache line selected for replacement and data stored in said first cache line selected for replacement, an entry initiated upon selection of a first cache line for replacement and retired upon committing said first cache line selected for replacement to said second level memory,
        a snoop write port receiving snoop write data and a corresponding snoop write address, and
        a first victim comparator connected to said first victim buffer and said snoop write port comparing said first victim address of each entry in said first victim buffer to said snoop write address,
    said first level cache controller enabling a write of said snoop write data into a corresponding entry in said first victim buffer when said victim comparator detects a match between a snoop write address and a first victim address in said victim buffer;
    a second level memory controller connected to said first level cache controller and said second level cache controlling data transfers into and out of said second level cache, said second level cache controller including
        a second victim buffer having a plurality of entries, each entry storing a second victim address corresponding to data stored in said first cache line selected for replacement and said data stored in said first cache line selected for replacement, an entry initiated upon receipt of said first cache line selected for replacement from said first level cache controller and retired upon storing said first cache line selected for replacement to said second level memory,
        a direct memory access write port receiving direct memory access write data and a corresponding direct memory access write address of a direct memory access unit controlled data transfer, and
        a second victim comparator connected to said second victim buffer and said direct memory access write port comparing said second victim address of each entry in said second victim buffer to said direct memory access write address,
    said second level memory controller enabling a write of said direct memory access write data into a corresponding entry in said second victim buffer if said second victim comparator detects a match between a direct memory access write address and a second victim address in said second victim buffer and enabling a snoop write to said first level cache controller if said second victim comparator does not detect a match between a direct memory access write address and a second victim address in said second victim buffer.

2. The data processing system of claim 1, wherein:
    each cache line of said first level cache including a tag indicating a valid and a dirty status of said data stored therein;
    said second level memory controller including a set of shadow tags corresponding to said tags of said first level data cache;
    wherein said second level memory controller further includes a shadow tags comparator connected to said shadow tags and direct memory access write port comparing said address of each shadow tag to said direct memory access write address; and
    wherein said second level memory controller enables a snoop write to said first level cache controller if said shadow tags comparator detects a match between a direct memory access write address and the address of one of said shadow tags.

* * * * *